(12) United States Patent
Zhang et al.

(10) Patent No.: US 12,216,366 B2
(45) Date of Patent: Feb. 4, 2025

(54) PIXEL STRUCTURE, DISPLAY PANEL AND DISPLAY DEVICE

(71) Applicants: Hefei BOE Optoelectronics Technology Co., Ltd., Anhui (CN); BOE Technology Group Co., Ltd., Beijing (CN)

(72) Inventors: Qianqian Zhang, Beijing (CN); Chun Wang, Beijing (CN); Yuqi Liu, Beijing (CN); Hui Wang, Beijing (CN); Hongmei Yang, Beijing (CN); Wei Ren, Beijing (CN)

(73) Assignees: HEFEI BOE OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/912,911

(22) PCT Filed: Apr. 29, 2022

(86) PCT No.: PCT/CN2022/090564
§ 371 (c)(1),
(2) Date: Sep. 20, 2022

(87) PCT Pub. No.: WO2023/206472
PCT Pub. Date: Nov. 2, 2023

(65) Prior Publication Data
US 2024/0210768 A1    Jun. 27, 2024

(51) Int. Cl.
*G02F 1/1343* (2006.01)
*G02F 1/1368* (2006.01)
*H01L 27/12* (2006.01)

(52) U.S. Cl.
CPC ...... *G02F 1/134372* (2021.01); *H01L 27/124* (2013.01); *G02F 1/1368* (2013.01)

(58) Field of Classification Search
CPC . G02F 1/134372; G02F 1/1368; H01L 27/124
(Continued)

(56) References Cited

U.S. PATENT DOCUMENTS

| | | |
|---|---|---|
| 11,693,281 B2 | 7/2023 | Sakurai et al. |
| 2005/0179844 A1 | 8/2005 | Roosendaal et al. |

(Continued)

OTHER PUBLICATIONS

Non-final office Action of U.S. Appl. No. 17/441,272 issued on Aug. 1, 2023.
(Continued)

*Primary Examiner* — Charles S Chang
(74) *Attorney, Agent, or Firm* — Lippes Mathias LLP

(57) ABSTRACT

Provided is a pixel structure. The pixel structure includes: a first electrode, a second electrode, and a liquid crystal layer that are disposed on one side of a substrate and successively stacked, wherein one of the first electrode and the second electrode is a pixel electrode and the other of the first electrode and the second electrode is a common electrode, and the second electrode includes a plurality of electrode branches sequentially arranged in a first direction, wherein each of the electrode branches includes a first end portion, a body portion, and a second end portion that are successively connected in a second direction, the body portion including at least one body segment.

18 Claims, 10 Drawing Sheets

(58) Field of Classification Search
USPC .................................... 349/145–146
See application file for complete search history.

(56) References Cited

U.S. PATENT DOCUMENTS

| | | | |
|---|---|---|---|
| 2008/0204614 A1* | 8/2008 | Aota | ................ G02F 1/134363 |
| | | | 349/33 |
| 2012/0218501 A1 | 8/2012 | Lee et al. | |
| 2015/0116644 A1* | 4/2015 | Morishita | ......... G02F 1/134363 |
| | | | 349/138 |
| 2017/0255067 A1 | 9/2017 | Ito | |
| 2021/0349357 A1 | 11/2021 | Chen | |
| 2022/0308406 A1 | 9/2022 | Liu et al. | |
| 2023/0060511 A1 | 3/2023 | Yang et al. | |

OTHER PUBLICATIONS

Non-final office Action of U.S. Appl. No. 17/976,079 issued on Aug. 4, 2023.
Final office Action of U.S. Appl. No. 17/441,272 issued on Jan. 8, 2024.
Advisory Action of U.S. Appl. No. 17/441,272 issued on Mar. 13, 2024.
Final office Action of U.S. Appl. No. 17/976,079 issued on Jan. 8, 2024.

\* cited by examiner

1P1D pixel structure

2P2D pixel structure

PIXEL STRUCTURE, DISPLAY PANEL AND DISPLAY DEVICE

CROSS-REFERENCE TO RELATED APPLICATION

This application is a 371 of PCT application No PCT/CN2022/090564, filed on Apr. 29, 2022, the disclosure of which is incorporated herein by reference in its entirety.

TECHNICAL FIELD

The present disclosure relates to the field of display technology and, in particular, relates to a pixel structure, a display panel and a display device.

BACKGROUND

Liquid-crystal display (LCD) panels are widely used in various types of display devices, such as in touch-type display devices, because of their advantages of high resolution, low cost and low power consumption.

Currently, LCD panels usually include a first electrode, a second electrode, and a liquid-crystal layer that are sequentially stacked. One of the first electrode and the second electrode is the pixel electrode and the other is the common electrode. The second electrode usually includes a plurality of electrode branches arranged at intervals and communicated with each other. The liquid-crystal molecules in the liquid-crystal layer can be deflected by the electric field formed by the first electrode and the second electrode, thereby realizing the display of the LCD panel.

SUMMARY

Embodiments of the present disclosure provide a pixel structure, a display panel and a display device. The technical solution is as follows.

In an aspect, a pixel structure is provided. The pixel structure includes:
  a first electrode, a second electrode and a liquid crystal layer disposed on one side of a substrate and successively stacked, wherein one of the first electrode and the second electrode is a pixel electrode and the other of the first electrode and the second electrode is a common electrode, and the second electrode includes:
  a plurality of electrode branches sequentially arranged in a first direction, wherein each of the electrode branches includes a first end portion, a body portion and a second end portion that are successively connected in a second direction, the body portion including at least one body segment, and an extending direction of each of the body segment, extending direction of the first end portion and an extending direction of the second end portion being intersected with the second direction, and the second direction being perpendicular to the first direction;
  wherein the first end portions of the plurality of electrode branches are communicated with each other, the second end portions of the plurality of electrode branches are communicated with each other, the first end portions of at least two electrode branches are communicated with each other in an arc, the second end portions of at least two electrode branches are communicated with each other in an arc, and a slit is disposed between each of the two adjacent electrode branches, the slit including a first slit segment, a second slit segment and a third slit segment that are successively connected in the second direction, and an angle between at least one of the first slit segment and the third slit segment and the second slit segment being equal to 180 degrees.

Optionally, the first electrode is a common electrode, and the second electrode is a pixel electrode.

Optionally, the pixel structure further includes: a thin film transistor, wherein the second electrode further includes a connection portion;
  wherein the thin film transistor is connected to the second end portion of the plurality of electrode branches by the connection portion and is configured to supply a voltage to the plurality of electrode branches.

Optionally, the body portion of each of the electrode branches includes the body segment, and the extending direction of the body segment, the extending direction of the first end portion and the extending direction of the second end portion are a third direction; and
  in the plurality of electrode branches, one end of the first end portion in a first target electrode branch protrudes in a direction away from remaining electrode branches except the first target electrode branch;
  wherein the first target electrode branch is an outermost electrode branch of the plurality of electrode branches, and a protruding direction of the first end portion of the first target electrode branch is in a same direction as an inclining direction of the first end portion, and the inclining direction of the first end portion is an inclining direction of the first end portion to a side distal from the body portion.

Optionally, in the plurality of electrode branches, one end of the second end portion of in a second target electrode branch protrudes in a direction away from remaining electrode branches except the second target electrode branch;
  wherein the second target electrode branch is another outermost electrode branch of the plurality of electrode branches, and a protruding direction of the second end portion of the second target electrode branch is in a same direction as an inclining direction of the second end portion, and the inclining direction of the second end portion is an inclining direction of the second end portion to a side distal from the body portion.

Optionally, in the second target electrode branch, an angle between the extending direction of the first end portion distal from the first target electrode branch and the third direction is less than or equal to 180 degrees.

Optionally, a protruding end of the first target electrode branch and a protruding end of the second target electrode branch both include a first edge, a second edge, a third edge and a fourth edge that are successively connected;
  wherein the first edge extends in the first direction, the second edge extends in the third direction, an extending direction of the third edge is intersected with the third direction at an angle greater than or equal to 45 degrees and a length of the third edge is greater than or equal to 2 μm, and the fourth edge extends in a direction intersecting the extending direction of the third edge.

Optionally, an angle between the extending direction of the third edge and the third direction is equal to 45 degrees or 60 degrees.

Optionally, a length of the third edge is less than or equal to 5 μm.

Optionally, the length of the third edge is greater than or equal to 3 μm.

Optionally, the body portion of each of the electrode branches includes a first body segment and a second body segment that are successively connected in the second direction;
    wherein the first body segment is connected to the first end portion and the second body segment, and the second body segment is further connected to the second end portion;
    wherein an extending direction of the first end portion and an extending direction of the first body segment are both a fourth direction, and an extending direction of the second end portion and an extending direction of the second body segment are both a fifth direction, the fourth direction being intersected with the fifth direction at an included angle between the fourth direction and the fifth direction greater than 90 degrees and less than 180 degrees.

Optionally, at least one of the body portions of the electrode branches further includes a corner portion, and the first body segment is connected to the second body segment by the corner portion;
    wherein the corner portion includes a first corner portion and a second corner portion connected in the second direction, the first corner portion is connected to the first body segment, and the second corner portion is connected to the second body segment;
    wherein the first corner portion extends in a sixth direction and the second corner portion extends in a seventh direction; wherein the sixth direction is intersected with the fourth direction, the seventh direction is intersected with the fifth direction, the sixth direction being intersected with the seventh direction, and angle between the sixth direction and the seventh direction is greater than or equal to 45 degrees and less than 180 degrees, and a depth of the first corner portion in the second direction and a depth of the second corner portion in the second direction are both greater than or equal to 2 μm.

Optionally, an angle between the sixth direction and the seventh direction is equal to 45 degrees.

Optionally, a depth of the first corner portion in the second direction and a depth of the second corner segment in the second direction are both equal to 3 μm.

Optionally, a depth of the first corner portion in the second direction and a depth of the second corner segment in the second direction are both equal to 2 μm;
    an orthographic projection of the first end portion on the substrate is overlapped with an orthographic projection of a black matrix disposed on one side of the substrate on the substrate; and
    an angle between the third slit segment and the second slit segment is equal to 180 degrees, an angle between the first slit segment and the second slit segment is greater than or equal to 45 degrees and less than 180 degrees, and a width of the first slit segment is greater than or equal to 3 μm in an extending direction of the first slit segment.

Optionally, the angle between the first slit segment and the second slit segment is equal to 45 degrees.

Optionally, an angle between the first slit segment and the second slit segment is equal to 180 degrees, and an angle between the third slit segment and the second slit segment is equal to 180 degrees.

Optionally, the first electrode and the second electrode both includes an indium tin oxide material.

In another aspect, a display panel is provided. The display panel includes: a substrate, a plurality of pixel structures described in the above aspect, and a color filter disposed on a side, distal from the substrate, of the pixel structures.

In still another aspect, a display device is provided. The display device includes: a drive circuit, and a display panel described in the above aspect;
    wherein the drive circuit is connected to the display panel and is configured to drive signals to the pixel structures in the display panel.

BRIEF DESCRIPTION OF THE DRAWINGS

In order to describe the technical solutions in the embodiments of the present disclosure more clearly, the following briefly describes the accompanying drawings required for describing the embodiments. Apparently, the accompanying drawings in the following description show merely some embodiments of the present disclosure, and those of ordinary skill in the art can still derive other drawings from these accompanying drawings without creative efforts.

DETAILED DESCRIPTION

Figure 1:
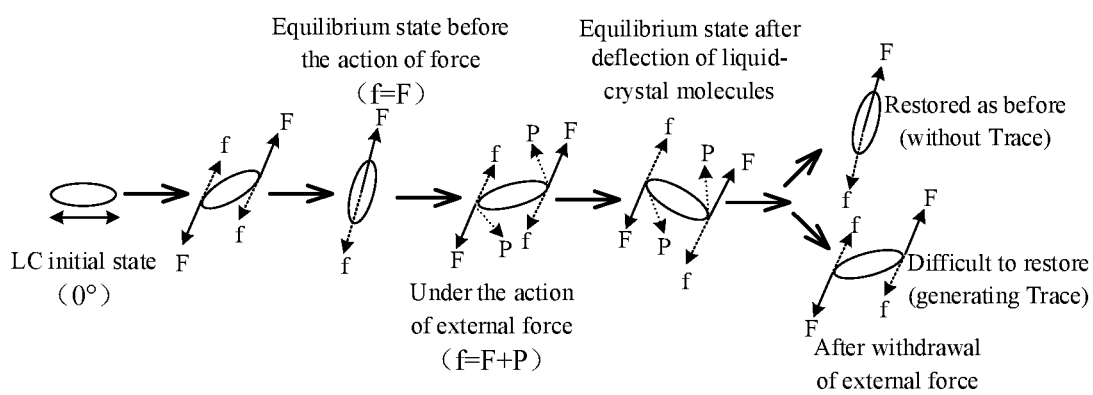
FIG. 1 is a schematic diagram of a mechanical analysis of a formation of Trace Mura according to some embodiments of the present disclosure.

For clearer descriptions of the objectives, technical solutions, and advantages of the present disclosure, the following further describes implementations of the present disclosure in detail with reference to the accompanying drawings.

In addition to the advantages describes in the background, LCD panels also have the advantages of wide viewing angle, high brightness and high contrast ratio, which have become a main display technology with wide application scenarios. For LCD display products with LCD panels (e.g., phones), improving the transmittance is always the design topic of the LCD panels. In addition to the increase in transmittance, the requirements for display quality are also increasing, and the display quality determines the competitive level of the display products. For the touch class LCD panel frequently subjected to external force, its requirement for display quality is higher. The external force can be a force applied by a user's finger when pressing or sliding on the LCD, and press or slide can be referred to as the touch operation.

Currently, LCD panels include an upper substrate and a lower substrate. The upper substrate generally includes a color filter (CF). The lower substrate generally includes a substrate, and a first electrode, a second electrode, and a liquid-crystal layer disposed on one side of the substrate and successively stacked in a direction close to the upper substrate. One of the first electrode and the second electrode is the pixel electrode and the other is the common electrode to drive the deflection of liquid-crystal molecules in the liquid-crystal layer cooperatively. Because the electric field at the connection of a plurality of electrode branches in the second electrode is disordered, the deflection direction of the liquid-crystal molecules at the connection of the plurality of electrode branches is easily affected by external forces and the deflection direction is easily disordered, which leads to Trace Mura problem in the LCD panel and poor display quality. It should be noted that the LCD panel also includes the alignment film layer P1 disposed between the upper and lower substrate, which can be used to align the liquid-crystal molecules, such that the liquid-crystal molecules are arranged regularly. Trace Mura is explained in detail as follows.

Trace Mura indicates when the finger presses or slides the L255 screen, i.e., when the user touches the LCD panel by pressing or sliding, the liquid-crystal molecules deforms and the deflection direction is easily disturbed, i.e., the liquid crystal molecules are disordered. This further leads to a decrease in display brightness at the touch region, which is reflected in dark touch marks. In the case that the external force is removed, that is, the finger leaves the LCD panel to stop pressing or sliding, the deflection direction of the liquid-crystal molecules can not be restored to the pre-touch arrangement within a certain period of time (generally not less than 5 seconds), the display brightness remains low, and traces appear. The bad caused by the traces is called "Trace Mura".

Referring to FIG. 1, the mechanical analysis of formation of Trace Mura is as follows. First, when the LCD panel is working normally, i.e., prior to the action of external forces, the liquid-crystal molecules in the liquid-crystal layer of the LCD panel are subjected to an electric field force F by the electric field and a reversion force (which can also be called anchoring force) f by the alignment film layer P1, and F and f can be in equilibrium, satisfying $F=f$. In the case that the LCD panel is subjected to external forces, the liquid-crystal molecules are subjected to a corresponding pressure P, thus forming a new equilibrium state, satisfying $f=F+P$. It can be seen that $f>F$. Upon the removal of external forces, because $f>F$, the liquid-crystal molecules are not easy to deflect. In this way, in the case that a strong electric field is acted on the liquid-crystal layer, the liquid-crystal molecules can be deflected back to the equilibrium state prior to the action of external forces. In the case that no strong electric field is acted on the liquid-crystal layer, the liquid-crystal molecules are difficult to deflect back to the equilibrium state prior to the action of external forces, producing traces and leading to Trace Mura problem of the LCD panel. The electric field refers to the electric field formed by the common electrode and the pixel electrode.

It should be noted that the electrode branches in the second electrode are generally divided into an intermediate region and end regions disposed on both sides of the intermediate region based on the field strength E The field strength E in the end region is generally weaker, and the field strength E in the intermediate region is generally stronger. In addition, the stronger the field strength E is, the greater the electric field force F is, the easier the liquid crystal molecules are deflected, i.e., the deflection angle can be larger, and the stronger the reversion force f is. On the contrary, the weaker the field strength E is, the weaker the electric field force F is, the less likely the liquid crystal molecules are to deflect, i.e., the deflection angle is generally smaller, and the weaker the restoring force f is. Because of the special shape of the end region, the arrangement of liquid-crystal molecules in the end region is disorderly, and the deflection direction is prone to abrupt changes. Upon the action of external force, relative to prior to the action of external force, the deflection angle of the liquid-crystal molecules in the end region is larger, that is, the liquid-crystal molecules in the end region are difficult to loosen itself to release space and make the liquid-crystal molecules in the middle region not being restored to the equilibrium state can not be restored and produce Trace.

In this way, end corners are usually disposed at the communication of each of the electrode branches to improve the undesirable problems caused by Trace Mura. However, this arrangement will undoubtedly lead to the reduction of transmittance and contrast ratio (CR) of the LCD panel, which affects the display quality, and the display effect remains poor.

Based on this, embodiments of the present disclosure provide a new pixel structure by analyzing the principle of Trace Mura. With this pixel structure, it is possible to realize better transmittance and CR of the LCD panel, and improve the Trace Mura problem to which the LCD panel is prone effectively and reliably.

Figure 2:
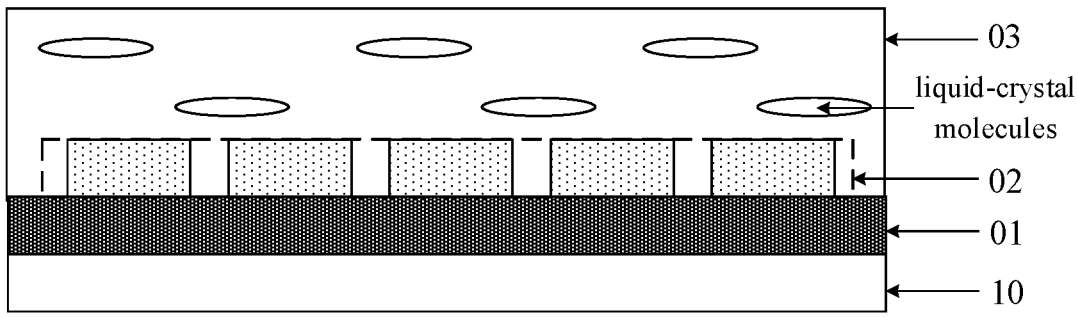
FIG. 2 is a schematic diagram of a structure of a pixel structure according to some embodiments of the present disclosure.

FIG. 2 is a schematic diagram of a structure of a pixel structure according to some embodiments of the present disclosure. As shown in FIG. 2, the pixel structure includes a first electrode 01, a second electrode 02, and a liquid-crystal layer 03, which are disposed on one side of the substrate 10 and successively stacked. For example, the first electrode 01 may be a common electrode, and the second electrode 02 may be a pixel electrode. Alternatively, the first electrode 01 may be a pixel electrode, and the second electrode 02 may be a common electrode. The liquid-crystal molecules in liquid-crystal layer 03 can be deflected by the electric field formed by the first electrode 01 and the second electrode 02 (i.e., the pixel electrode and the common electrode).

Figure 3:
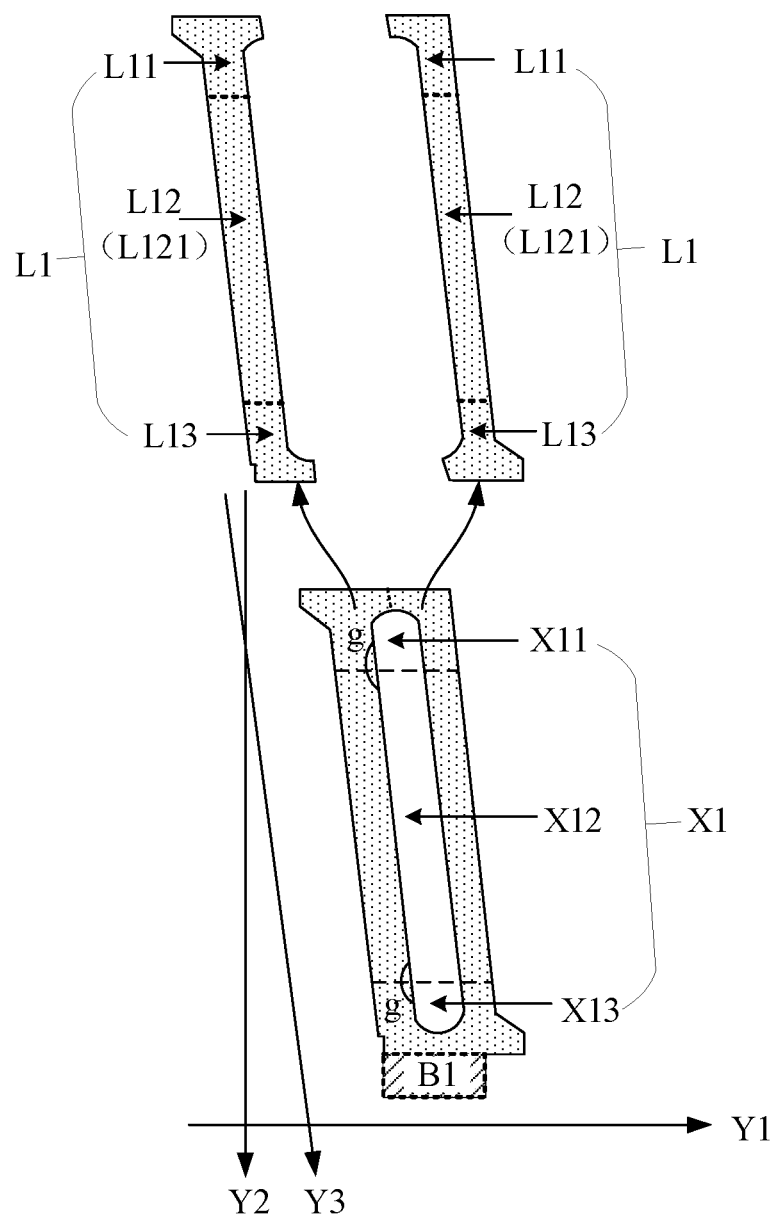
FIG. 3 is a schematic diagram of a structure of a second electrode according to some embodiments of the present disclosure.

Then referring to FIG. 3, the second electrode 02 (i.e., the electrode of the first electrode 01 and the second electrode 02 near the liquid crystal layer 03) in embodiments of the present disclosure may include a plurality of electrode branches L1.

The plurality of electrode branches L1 are arranged sequentially in a first direction Y1. Each of the electrode branches L1 includes a first end portion L11, a body portion L12, and a second end portion L13 that are successively connected in a second direction Y2. The body portion L12 includes at least one body segment L121, and an extension direction of each of the body segments L121, an extension direction of the first end portion L11, and a second end portion L13 are intersected with the second direction Y2, and the second direction Y2 is perpendicular to the first direction Y1. Taking the row direction of the plurality of pixel structures arranged in the array as a reference, the first direction Y1 may refer to the pixel row direction and the second direction Y2 may refer to the pixel column direction. In addition, the first end portions L11 of the plurality of electrode branches L1 are communicated with each other, and the second end portions L13 of the plurality of electrode branches L1 are communicated with each other. The first end portions L11 of at least two electrode branches L1 are communicated with each other in an arc, and the second end portions L13 of at least two electrode branches L1 communicated with each other in an arc.

For example, the second electrode 02 illustrated in FIG. 3 includes two electrode branches L1, each including one body segment L121 in the body portion L12 of the electrode branch L1, and the extending direction of the body portion L12, the extending direction of the first end portion L11 and the extending direction of the second end portion L13 are the same (the third direction Y3 shown in FIG. 3), intersecting the second direction Y2. The first end portions L11 of the two electrode branches L1 are communicated with each other in an arc and the second end portions L13 of the two electrode branches L1 are communicated with each other in an arc. Referring to FIG. 3, the connection being in an arc may indicate the arc protruding in a direction away from the body portion L12. In some embodiments, the arc may also indicate that the arc is concaved in a direction away from the body portion L12.

Based on the above structure, it can be seen in FIG. 3 that each of the two adjacent electrode branches L1 may have a slit X1 disposed between them, which is an interval between each of the two adjacent electrode branches L1. In other words, a plurality of electrode branches L1 in the second electrode 02 are actually arranged sequentially spaced in the first direction Y1. The slit X1 includes a first slit segment X11, a second slit segment X12 and a third slit segment X13 that are successively connected in the second direction Y2. In conjunction with the structure of the electrode branch L1, it can be seen that the first slit segment X11 can be considered as a slit between the first end portions L11 of every two adjacent electrode branches L1, i.e., close to the first end portion L11 of the electrode branch L1 and having the same structure and extending direction as the first end portion L11. The second slit segment X12 can be considered as a slit between the body portion L12 of each of the two adjacent electrode branches L1, i.e., close to the body portion L12 of the electrode branch L1, and having the same structure and extending direction as the body portion L12. The third slit segment X13 may be considered to be a slit between the second end portion L13 of each of the two adjacent electrode branches L1, i.e, close to the second end portion L13 of the electrode branch L1, and having the same structure and extending direction as the second end portion L13.

It should also be noted that, in the second direction Y2, the length of the first end portion L11 and the length of the second end portion L13 of the electrode branch L1 are both smaller than the length of the body portion L12. Accordingly, the length of the first slit segment X11 and the length of the third slit segment X13 are both smaller than the length of the second slit segment X12.

Referring to FIG. 3, in the embodiments of the present disclosure, an angle g between at least one of the first slit segment X11 and the third slit segment X13 and the second slit segment X12 is equal to 180 degrees. For example, in the second electrode 02 illustrated in FIG. 3, the angle g between the first slit segment X11 and the second slit segment X12, and the angle g between the third slit segment X13 and the second slit segment X12 are both equal to 180 degrees.

Based on the above embodiment, it can be seen that the angle g equal to 180 degrees between the first slit segment X11 and the second slit segment X12 can be equivalent to that the communication of the first end portions L11 of each of the two adjacent electrode branches L1 does not have an inner corner. Referring to FIG. 3, the inner corner can be referred to as the upper inner corner. Similarly, the angle g between the third slit segment X13 and the second slit segment X12 equal to 180 degrees can be equivalent to that the communication of the second end portions L13 of each of the adjacent electrode branches L1 does not have an inner corner. Referring to FIG. 3, the inner corner can be referred to as the lower inner corner. In other words, the disclosed embodiment eliminates the upper inner corner and/or the lower inner corner to effectively ensure that both the transmittance and contrast of the display panel can be better. Based on this, the electrode branches can be designed to improve the Trace Mura problem and ensure better display quality of the display panel. The specific design of the electrode branches can be described in the following examples.

In summary, embodiments of the present disclosure provide a pixel structure. The pixel structure includes a first electrode, a second electrode, and a liquid-crystal layer disposed on one side of a substrate and successively stacked. The second electrode includes a plurality of electrode branches arranged sequentially in the first direction, and each of the two adjacent electrode branches have slits between them. In the second direction intersecting the first direction, each of the electrode branches includes a first end portion, a body portion and a second end portion, and the slit includes a first slit segment, a second slit segment and a third slit segment, and the first end portions of the plurality of electrode branches are communicated with each other, and the second end portions are communicated with each other. Because the angle between the first slit segment and/or the third slit segment and the second slit segment is equal to 180 degrees, it is possible to make the communication of the first end portions and/or the communication of the second end portions of each of the two adjacent electrode branches do not have inner corners. In this way, the transmittance of the display panel can be made better. Based on this, the shape of the electrode branches can be flexibly set to improve the Trace Mura problem and a better display quality of the display panel is ensured.

Optionally, the following embodiment of the present disclosure is illustrated with the first electrode 01 as a common electrode and the second electrode 02 as a pixel electrode. That is, the embodiments of the present disclosure may be an improvement to the structure of the pixel electrode so as to ensure a better transmittance and contrast of the display panel while also effectively and reliably improving the Trace Mura problem that is common in the display panel. In the case that the second electrode 02 is a common electrode, it can be considered that the present disclosure embodiment is an improvement of the structure of the common electrode.

It should be noted that, with reference to FIG. 2, the first electrode 01 is generally provided on the substrate 10 as a whole layer, while the second electrode 02 generally includes a plurality of electrode patterns arranged at intervals, and the improvement of the second electrode 02 in the embodiment of the present disclosure can be considered as an improvement of the individual electrode patterns in the second electrode 02.

Optionally, the pixel structure in embodiments of the present disclosure may also include a thin film transistor (TFT). And, with continued reference to FIG. 3, the second electrode 02 may also include a connection portion B1.

The thin film transistor TFT may be connected to the second end portion L13 of the plurality of electrode branches L1 through the connection portion B1 and is configured to supply a voltage to the plurality of electrode branches L1. For example, the supplied voltage may be a pixel voltage Vop to drive the deflection of the liquid-crystal molecules. The electric field formed by the common electrode and the pixel electrode described above may refer to an electric field formed by the pressure difference between that pixel voltage Vop and the common voltage Vcom. The common voltage Vcom is the voltage loaded to the common electrode. The thin film transistor TFT that supplies the voltage may be part of the pixel circuit.

Accordingly, based on the above connection, it is known that in the disclosed embodiment, the second end portion L13 of the electrode branch L1 may be considered to be the side where the TFT is disposed, and the first end portion L11 of the electrode branch L1 may be considered to be the opposite side of the side where the TFT is disposed, thereby further achieving a distinction between the first end portion L11 and the second end portion L13.

Optionally, the substrate 10 may be generally divided into a plurality of pixel domains arranged in an array, and the display panel may include a plurality of pixel structures, and the second electrode 02 in a pixel structure may occupy two adjacent pixel domains disposed in the same column, and the pixel structures may also be referred to as 1P2D two-domain pixel structures. Alternatively, the second electrode 02 in a pixel structure may occupy only one pixel domain, and the type of pixel structure may also be referred to as a single-domain pixel structure. That is, the pixel structure can usually be divided into various structure types such as double-domain and single-domain, and the embodiments of the present disclosure have different designs for different types of electrode branches in the pixel structure as follows, thereby reliably improving the Trace Mura problem of display panels including various types of pixel structures.

Figure 4:
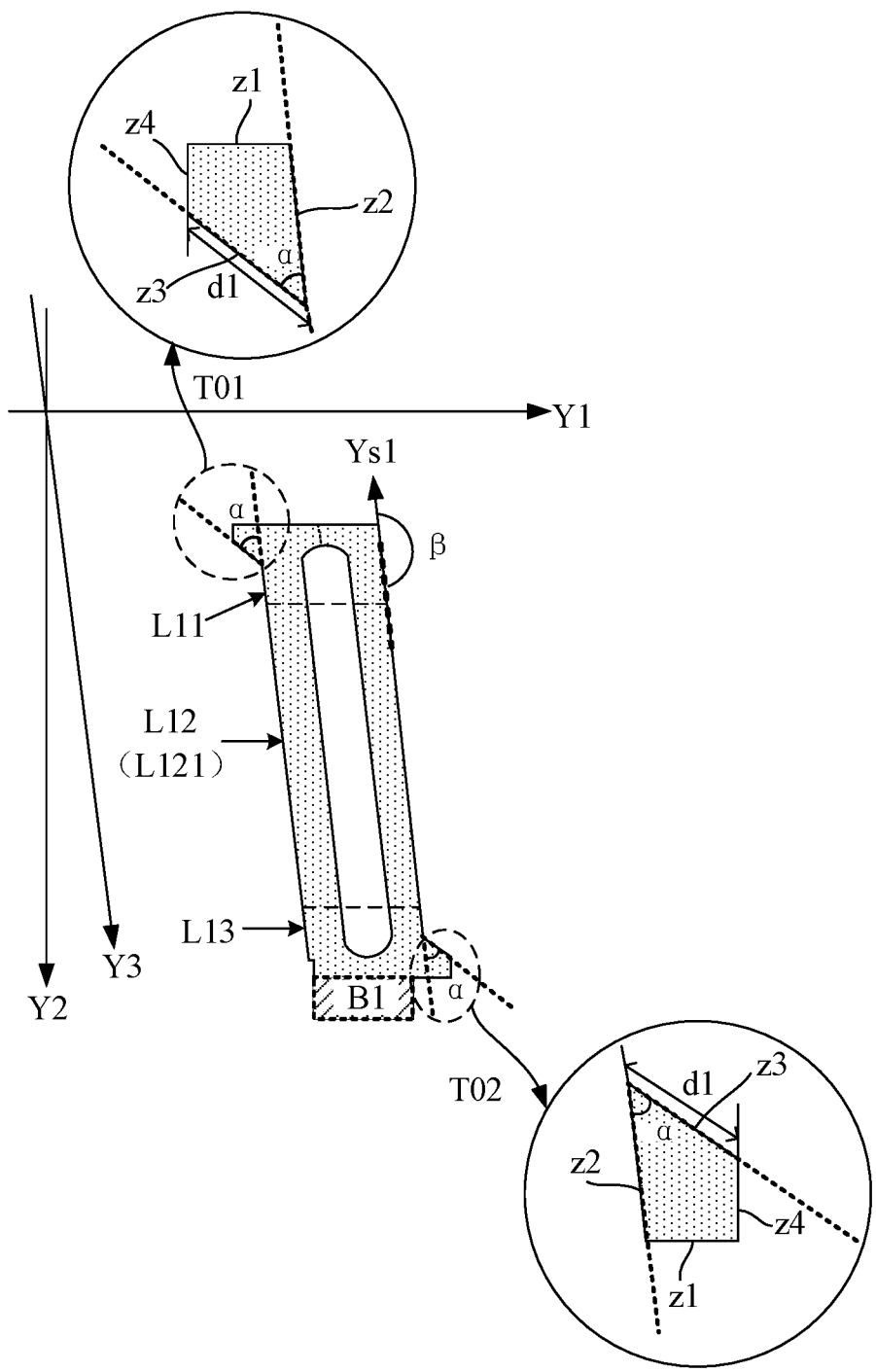
FIG. 4 is a schematic diagram of a structure of another second electrode according to some embodiments of the present disclosure.

As an optional implementation, for the single-domain pixel structure, it can be seen in the FIG. 3 and FIG. 4 that the body portion L12 of each of the plurality of electrode branches L1 may have only one body segment L121, and the extending direction of the body segment L121, the extending direction of the first end portion L11, and the extending direction of the second end portion L13 are all the third direction shown in FIG. 1n other words, the body portions L12 of the plurality of electrode branches L1 may be parallel to each other.

Based on this, one end of the first end portion L11 in the first target electrode branch of the plurality of electrode branches L1 may protrude in a direction away from remaining electrode branches L1 except the first target electrode branch. That is, the first target electrode branch may have a first protrusion T01 as shown in FIG. 4, and the first protrusion T01 may also be referred to as an upper outer corner disposed on the opposite side of the side where the TFT is disposed.

The first target electrode branch is the outermost electrode branch of the plurality of electrode branches L1, and the protruding direction of the first end portion L11 of the first target electrode branch is a same direction as an inclining direction of the first end portion L11, i.e., in exactly the same direction. The inclining direction of the first end portion L11 may refer to the direction in which the first end portion L11 inclines toward the side distal from the body portion L12. In this way, the end of the first target electrode branch in which the first end portion L11 protrudes is the end that is not connected to the first end portion L11 of the remaining electrode branch L1. For the pixel structure shown in FIG. 4, the first target electrode branch is the first electrode branch L1 disposed on the left side of the two electrode branches L1 included in the second electrode 02, and belongs to the first electrode branch L1 arranged in the first direction Y1.

By setting the first end portion L11 of the first target electrode branch to have a first protrusion T01 protruding in the above direction, i.e., by setting the second electrode 02 to also have an upper outer corner, the liquid-crystal molecules disposed at the position (i.e., the upper region described in the above embodiment) can also be quickly deflected back to the equilibrium state under the action of the electric field, such that the liquid-crystal molecules at remaining positions can be released for the arrangement state of the remaining positions. The liquid-crystal molecules at the remaining positions are quickly deflected back to the equilibrium state, thus avoiding the disorder of the liquid-crystal molecules and improving the Trace Mura problem.

Referring to FIG. 4 again, in the plurality of electrode branches L1 describes in the disclosed embodiment, one end of the second end portion L13 in the second target electrode branch may protrude in a direction away from the remaining electrode branches L1 except the second target electrode branch. That is, the second target electrode branch may have a second protrusion T02 shown in FIG. 4, and the second protrusion T02 may also be referred to as an outer corner of the lower end disposed on the side where the TFT is disposed.

The second target electrode branch is another outermost electrode branch of the plurality of electrode branches L1, and a protruding direction of the second end portion L13 of the second target electrode branch is in a same direction as an inclining direction of the second end portion L13, i.e., in exactly the same direction. The inclining direction of the second end portion L13 may also refer to the direction in which the second end portion L13 inclines toward the side distal from the body portion L12. In this way, the end of the second target electrode branch in which the second end portion L13 protrudes is the end that is not connected to the second end portion L13 of the remaining electrode branch L1. For the structure shown in FIG. 4, the second target electrode branch is the electrode branch L1 on the right side of the two electrode branches L1 included in the second electrode 02, which is the last electrode branch L1 arranged in the first direction Y1. It should be noted that the inclining direction of the first end portion L11 and the inclining direction of the second end portion L13 can also be referred to the slit inclining direction, or the slit direction for short, As setting the first protrusion T01 described above, by setting the second end portion L13 of the second target electrode branch to have the second protrusion T02 protruding in the above direction, i.e., by setting the second electrode 02 to also have a lower outer corner, the liquid-crystal molecules disposed at this position (i.e., the lower end described in the above embodiment) can also be quickly deflected back to the equilibrium state, such that the liquid-crystal molecules at the remaining positions can be released for the arrangement state of the remaining positions. The liquid-crystal molecules at the remaining positions are quickly deflected back to the equilibrium state, thus avoiding the disorder of the liquid-crystal molecules and improving the Trace Mura problem.

Because the second end portion L13 of the electrode branch L1 (i.e., the side where the TFT is disposed) has a more complicated structure, it is also possible to set only the first end portion L11 of the first target electrode branch (i.e., the opposite side of the side where the TFT is disposed) to have an outer corner to improve the Trace Mura problem.

Optionally, referring to the enlarged schematic diagrams of the first protrusion T01 and the second protrusion T02 shown in FIG. 4, it can be seen that a shape of a protruding end of the first target electrode branch (i.e., the first protrusion T01) and the shape of a protruding end of the second target electrode branch (i.e., the second protrusion T02) can both include a first edge z1, a second edge z2, a third edge z3, and a fourth edge z4 that are successively connected.

Referring to FIG. 4, a first edge z1 may extend in the first direction Y1. The second edge z2 may extend in the third direction Y3. An extending direction of the third edge z3 may be intersected with the third direction Y3 at an angle $\alpha$ greater than or equal to 45 degrees. Because the second edge z2 extends in the third direction Y3, the angle $\alpha$ may be the angle between the second edge z2 and the third edge z3, and the angle $\alpha$ is oriented close to the first edge z1. The length d1 of the third edge z3 may be greater than or equal to ($\geq$) 2 μm. The fourth edge z4 may extend in a direction intersecting the extending direction of the third edge.

Optionally, the shape of the first edge z1, the second edge z2, the third edge z3, and the fourth edge z4 that are successively connected may be a trapezoid as shown in FIG. 4. Alternatively, in some other embodiments, it may be other shapes, such as an irregular quadrilateral with the fourth edge z4 being curved.

Optionally, in embodiments of the present disclosure, the angle $\alpha$ between the extending direction of the third edge z3 and the third direction Y3 can be equal to 45 degrees or 60 degrees. That is, the angle between the second edge z2 and the second edge z3 is equal to 45 degrees or 60 degrees.

Optionally, in embodiments of the present disclosure, the length d1 of the third edge z3 may be less than or equal to 5 μm in addition to greater than or equal to 2 μm. Considering process limitation effects, the length d1 of the third edge z3 may preferably be greater than or equal to 3 μm.

It has been tested and verified that by setting the angle $\alpha$ between the second edge z2 and the second edge z3 equal to 45 degrees or 60 degrees, and/or, setting the length d1 of the third edge z3 greater than or equal to 3 microns, the Trace Mura problem can be effectively solved while ensuring the maximum transmittance, thus reliably improving the display quality of the display panel.

In some other embodiments, the shape of the protruding end of the first target electrode branch (i.e., the first protrusion T01) and the shape of the protruding end of the second target electrode branch (i.e., the second protrusion T02) may also be triangular. For example, referring to FIG. 4, the fourth edge z4 does not exist and the third edge z3 is directly connected to the first edge z1.

Optionally, as can be seen with continued reference to FIG. 4, in the embodiment of the present disclosure, the angle $\beta$ between the extending direction Ys1 and the third direction Y3 in the first end portion L11 of the second target electrode branch (e.g., the electrode branch L1 disposed on the right side in the structure shown in FIG. 4) distal from the end of the electrode branch L1 expect the second target electrode branch may be less than or equal to 180 degrees. Because the body portion L12 of the electrode branch L1 extends in the third direction Y3, the angle $\beta$ can also be considered as the angle between the extending direction Ys1 and the extending direction of the body portion L12.

For example, referring to FIG. 4 which illustrates an angle $\beta$ equal to 180 degrees, it can be considered that the end of the first end portion L11 of the second target electrode branch, which is distal from the remaining electrode branches L1 expect the second target electrode branch, is parallel to the slit direction. Similarly, in the case that the angle $\beta$ is less than 180 degrees, it can be considered that the end of the first end portion L11 of the second target electrode branch, which is distal from the remaining electrode branches except the second target electrode branch, is at an acute angle to the slit direction. In this way, the Trace Mura problem of the display panel can be further reliably avoided.

It should be noted that, referring to FIG. 4, the above design can be understood as follows. Among the outermost two electrode branches L1 included in the plurality of electrode branches L1, only the first end portion L11 of one electrode branch L1 has a protruding outer corner, while the first end portion L11 of the other electrode branch does not have an outer corner. The second end portion L13 is identical and is not repeated herein.

Figure 5:
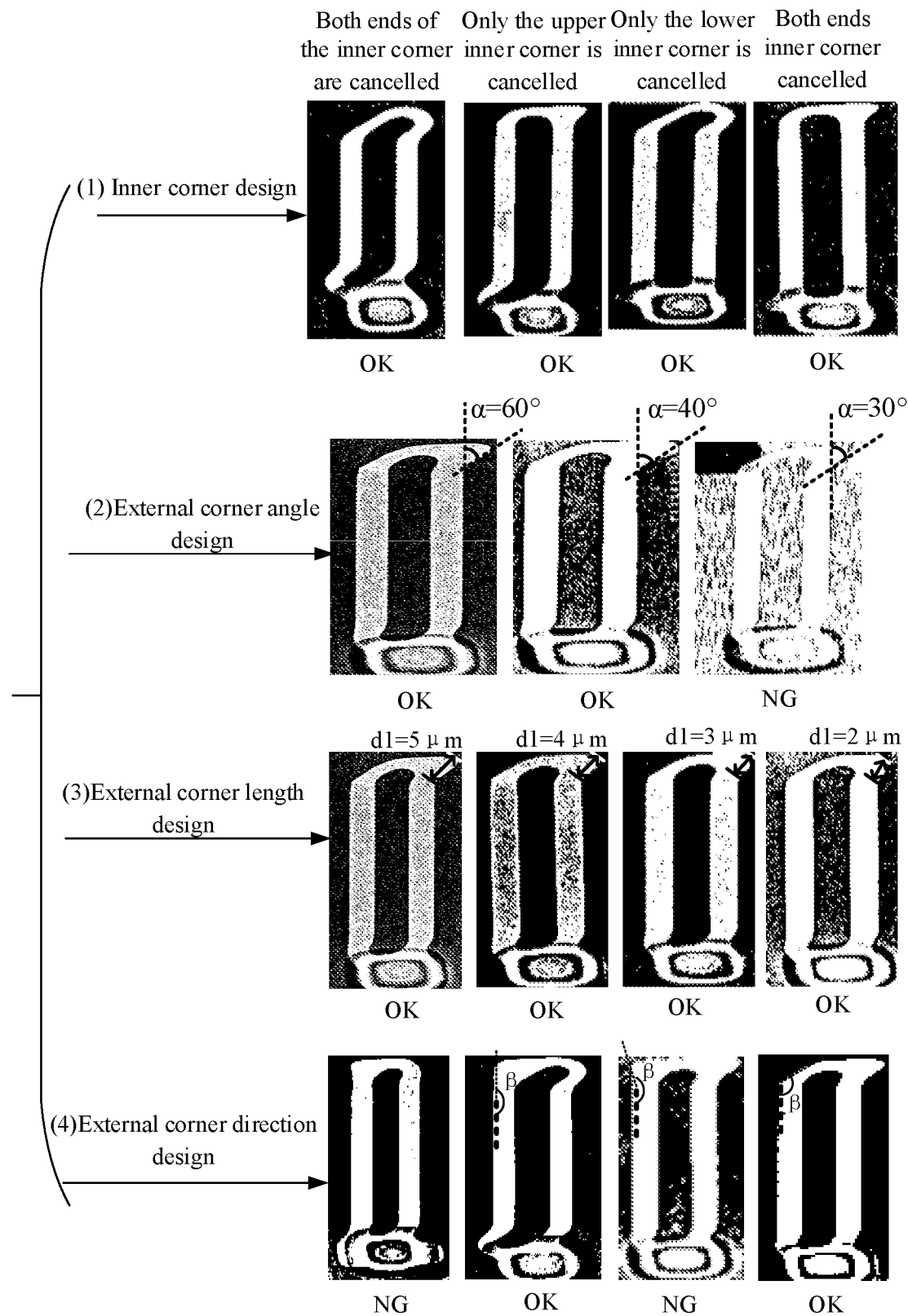
FIG. 5 is a comparative diagram of a test with different designs for a second electrode according to some embodiments of the present disclosure.

The above designs regarding the parameters of the embodiments are reliably acquired by validation and test. In the validation, 4 groups of influence factors can be applied to verify each of them. Referring to FIG. 5, these four groups of influence factors can include (1) inner corner design, (2) outer corner angle (i.e., angle $\alpha$) design, (3) outer corner length (i.e., length of the third edge z3) design, and (4) outer corner direction design. FIG. 5 shows the comparison graphs under each group of influence factors. "OK" indicates Trace can be eliminated and "NG" indicates Trace cannot be eliminated and the design fails.

Referring to the comparison the influence factor of group (1) in FIG. 5, it can be seen that for the above single-domain pixel structure, the transmittance can be improved by eliminating the upper inner corner and/or the lower inner corner, and the Trace can also be improved by not eliminating the inner corner, but the transmittance is poorer in this case. In addition, it has been tested that eliminating both the upper inner corner and the lower inner corner only slows down the deflection time of the liquid-crystal molecules by about 1 to 2 second(s) compared to eliminating only the upper inner corner or the lower inner corner, which does not affect the display image quality. Thus, referring to FIG. 5, the result of the comparison of the influence factor of group (1) is that the inner corner can be canceled.

Referring to the comparison the influence factor of group (2) in FIG. 5, it can be seen that for the above single-domain pixel structure, Trace can be effectively improved by designing the angle $\alpha$ between the second edge z2 and the second edge 23 in the upper outer corner (i.e., the outer corner angle) equal to 45 degrees or 60 degrees. In the case that the angle $\alpha$ between the second edge z2 and the second edge z3 is equal to 30 degrees, Trace is not improved, and group (2) fails. Thus, referring to FIG. 5, the result of the comparison of the influence factors of group (2) is that the angle $\alpha$ between the second edge z2 and the second edge z3 can be designed to be greater than or equal to 45 degrees.

Referring to the comparison the influence factor of group (3) in FIG. 5, it can be seen that for the above single-domain pixel structure, the Trace can be effectively improved by designing the length of the third edge z3 (i.e., the length of the outer corner) d1 in the upper outer corner to range between 2 and 5 μm. However, considering the process margin, it is recommended to design the outer corner length d1 greater than or equal to 3 µm.

Referring to the comparison the influence factor of group (4) in FIG. 5, it can be seen that for the above single-domain pixel structure, only one of the two outermost electrode branches L1 can be designed to have an outwardly protruding upper outer corner, while the other electrode branch L1 do not have an outwardly protruding upper outer corner to effectively improve Trace. The other electrode branch L1 not having the outwardly protruding upper outer corner indicates that the angle β between the extending direction Y3 and the extending direction Ys1 shown in FIG. 5 is less than or equal to 180 degrees, parallel to the slit direction, at an acute angle or at a right angle, etc. As a result, with reference to FIG. 5, the result of the comparison of the influence factor of group (4) is that: in the second electrode 02, the outer corner of the first end portion L11 on one side is retained, the outer corner of the first end portion L11 on the other side is cancelled, and the extending direction of one end of the first end portion L11 on the other side is the same as the slit direction.

Figure 6:
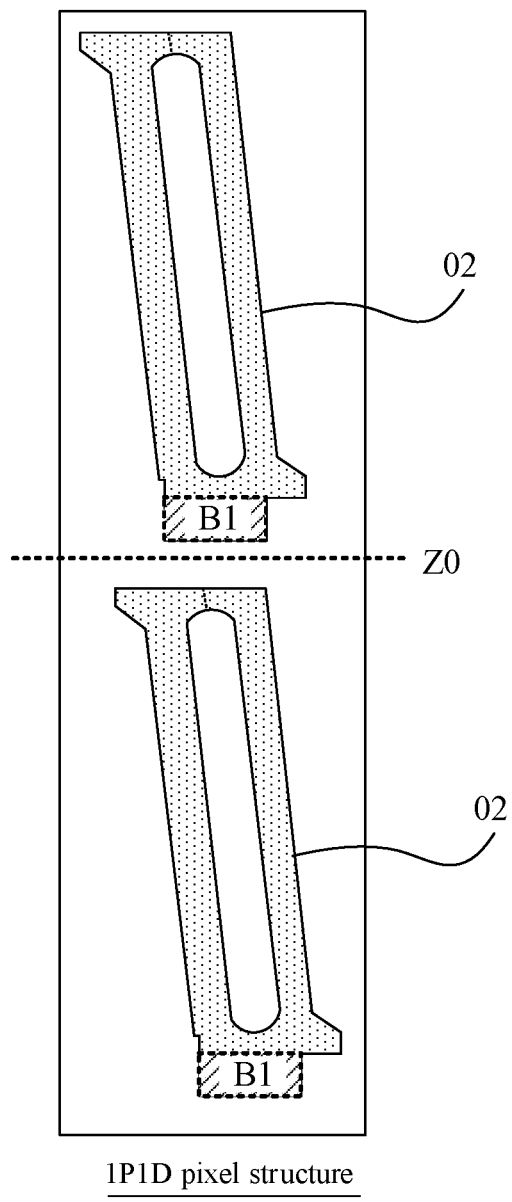
FIG. 6 is a schematic diagram of a structure of a second electrode in a 1P1D structure according to some embodiments of the present disclosure.
Figure 7:
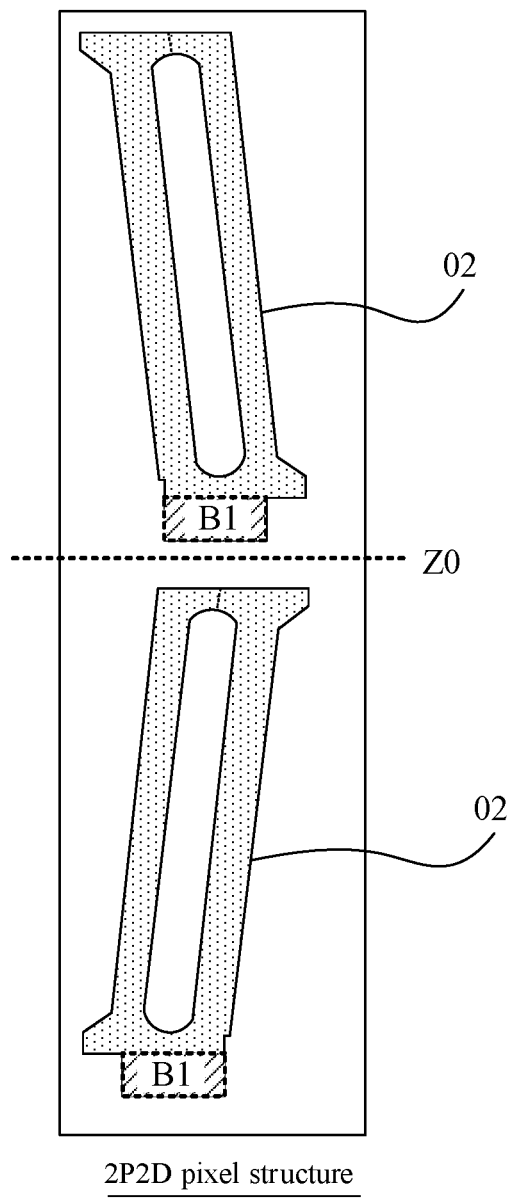
FIG. 7 is a schematic diagram of a structure of a second electrode in a 2P2D structure according to some embodiments of the present disclosure.

It should be noted that the single-domain pixel structure may include a 1P1D single-domain pixel structure and a 2P2D single-domain pixel structure. Referring to FIG. 6, the 1P1D single-domain pixel structure can refer to two pixel structures disposed in one column and adjacent to each other, with the second electrode 02 folded and overlapped in the symmetry axis Z0 identical to the slit direction. Referring to FIG. 7, it can be seen that the single-domain pixel structure of 2P2D can refer to two pixel structures disposed in one column and adjacent to each other, with the second electrode 02 folded along the symmetry axis Z0 without being overlapped and opposite the slit direction.

Figure 8:
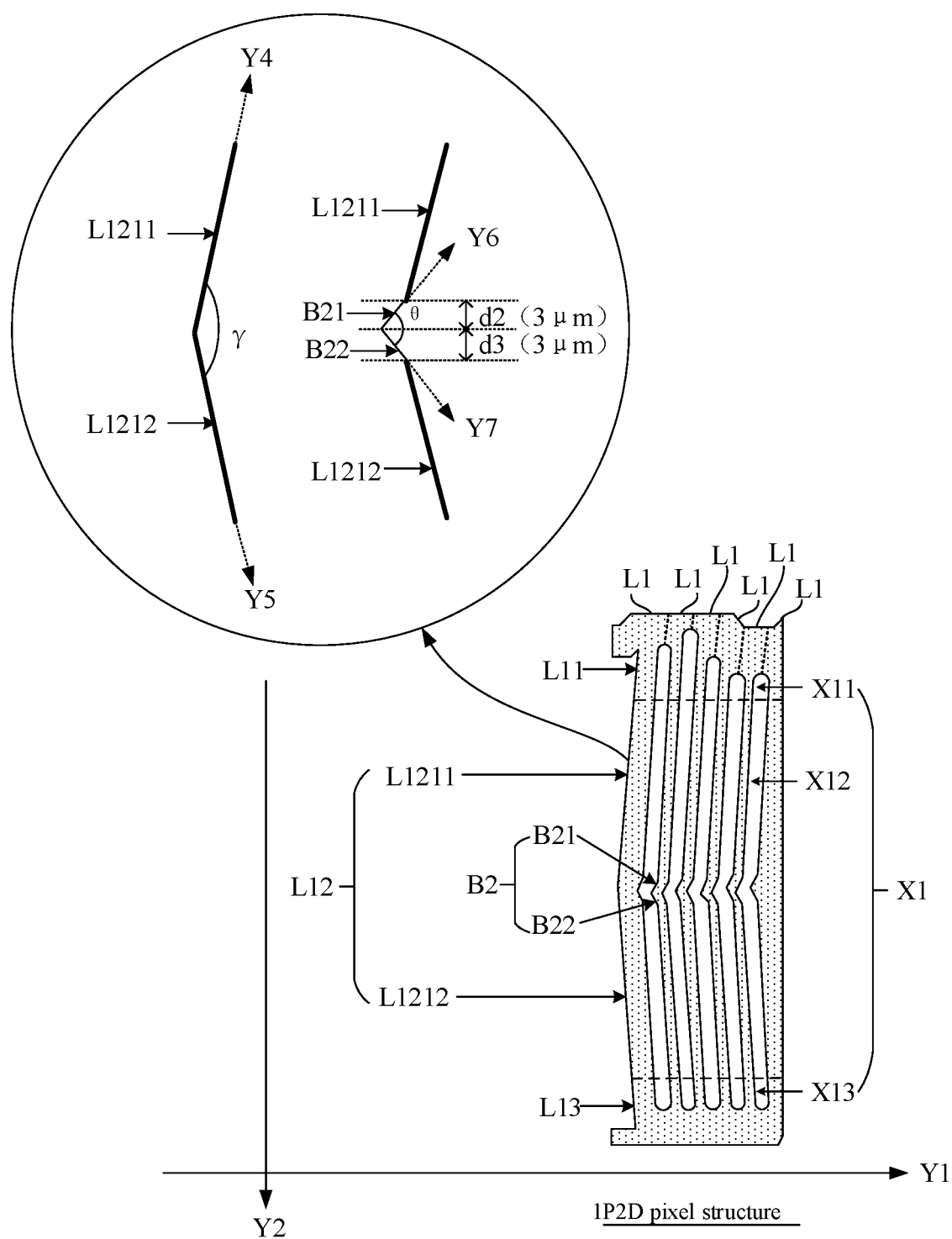
FIG. 8 is a schematic diagram of a structure of a second electrode in a 1P2D structure according to some embodiments of the present disclosure.

As another optional implementation, for the 1P2D two-domain pixel structure, with reference to FIG. 8, the body portion L12 of each of the electrode branches L1 may include a first body segment L1211 and a second body segment L1212 that are successively connected in the second direction Y2. i.e., the body portion L12 may have a total of two body segments.

The first body segment L1211 may be connected to the first end portion L11 and the second body segment L1212, and the second body segment L1212 may also be connected to the second end portion L13. The extending direction of the first end portion L11 and the extending direction of the first body segment L1211 may both be a fourth direction Y4, i.e., the extending direction is the same. The extending direction of the second end portion L13 and the extending direction of the second body segment L1212 are both in a fifth direction Y5, i.e., the extending direction is the same. The fourth direction Y4 and the fifth direction Y5 can be intersected with and the angle γ can be greater than 90 degrees and less than 180 degrees, i.e., not parallel. Based on the extending direction, it is known that the angle γ may refer to the angle between the first body segment L1211 and the second body segment L1212, and the angle γ is the angle toward the slit X1.

By setting the body portion L12 of the electrode branches L1 to include two body segments with the angle γ greater than 90 degrees and less than 180 degrees in the extending direction, normal deflection of the liquid-crystal molecules in the intermediate region can be ensured.

With continued reference to FIG. 8, it can be seen that at least one (e.g., each) body portion L12 of the electrode branch L1 may also include a corner portion B2, and the first body segment L1211 and the second body segment L1212 may be connected by the corner portion B2. The corner segment B2 may include a first corner portion B21 and a second corner portion B22 that are successively connected in the second direction Y2, and the first corner portion B21 is connected to the first body segment L1211 and the second corner portion B22 is connected to the second body segment L1212. That is, in the second direction Y2, the first body segment L1211, the first corner portion B21, the second corner portion B22, and the second body segment L1212 are successively connected. The corner portion B2 may also be referred to as an intermediate corner.

The first corner portion B21 extends in a sixth direction Y6 and the second corner portion B22 extends in a seventh direction Y7. The sixth direction Y6 is intersected with the fourth direction Y4. The seventh direction Y7 is intersected with the fifth direction Y5. And the sixth direction Y6 is intersected with the seventh direction Y7. In this way, it can be seen that any two of the first body segment L1211, the first corner portion B21, the second corner portion B22, and the second body segment L1212, which are successively connected, are not parallel.

Optionally, referring to FIG. 8, an angle θ between the sixth direction Y6 and the seventh direction Y7 may be greater than or equal to 45 degrees and less than 180 degrees. Based on the extending direction, it is known that the angle @ actually refers to the angle between the first corner portion B21 and the second corner portion B22. That is, in the embodiment of the present disclosure, the angle between the first corner portion B21 and the second corner portion B22 can be greater than or equal to 45 degrees and less than 180 degrees. In other words, the angle θ of the first corner portion B21 and the second corner portion B22 may be less than the angle γ of the first body segment L1211 and the second body segment L1212. Preferably, in the embodiment of the present disclosure, the angle θ may be equal to 45 degrees. It has been tested and verified that by setting the angle θ equal to 45 degrees, the Trace Mura problem can be effectively solved while ensuring the maximum transmittance.

Optionally, referring to FIG. 8, a depth d2 of the first corner portion B21 in the second direction Y2 and a depth d3 of the second corner portion B22 in the second direction Y2 may both be greater than or equal to 2 µm. i.e., the total depth of the intermediate corner in the second direction Y2 may be greater than or equal to 2+2 µm.

For example, considering the actual level of the process, in the embodiment of the present disclosure, referring to FIG. 8, the depth d2 of the first corner portion B21 in the second direction Y2 and the depth d2 of the second corner portion B22 in the second direction Y2 can both be equal to 3 µm. That is, the total depth of the intermediate corner in the second direction Y2 can be equal to 3+3 µm. Based on the embodiment, referring to FIG. 8, it can be seen that both the upper inner corner and the lower inner corner can be eliminated. That is, it is possible to arrange the angle g equal to 180 degrees between the first slit segment X11 and the second slit segment X12, and to arrange the angle g equal to 180 degrees between the third slit segment X13 and the second slit segment X12. It is verified that the pixel structure under this arrangement can guarantee the good transmittance of the display panel and effectively solve the Trace Mura problem of the display panel.

Figure 9:
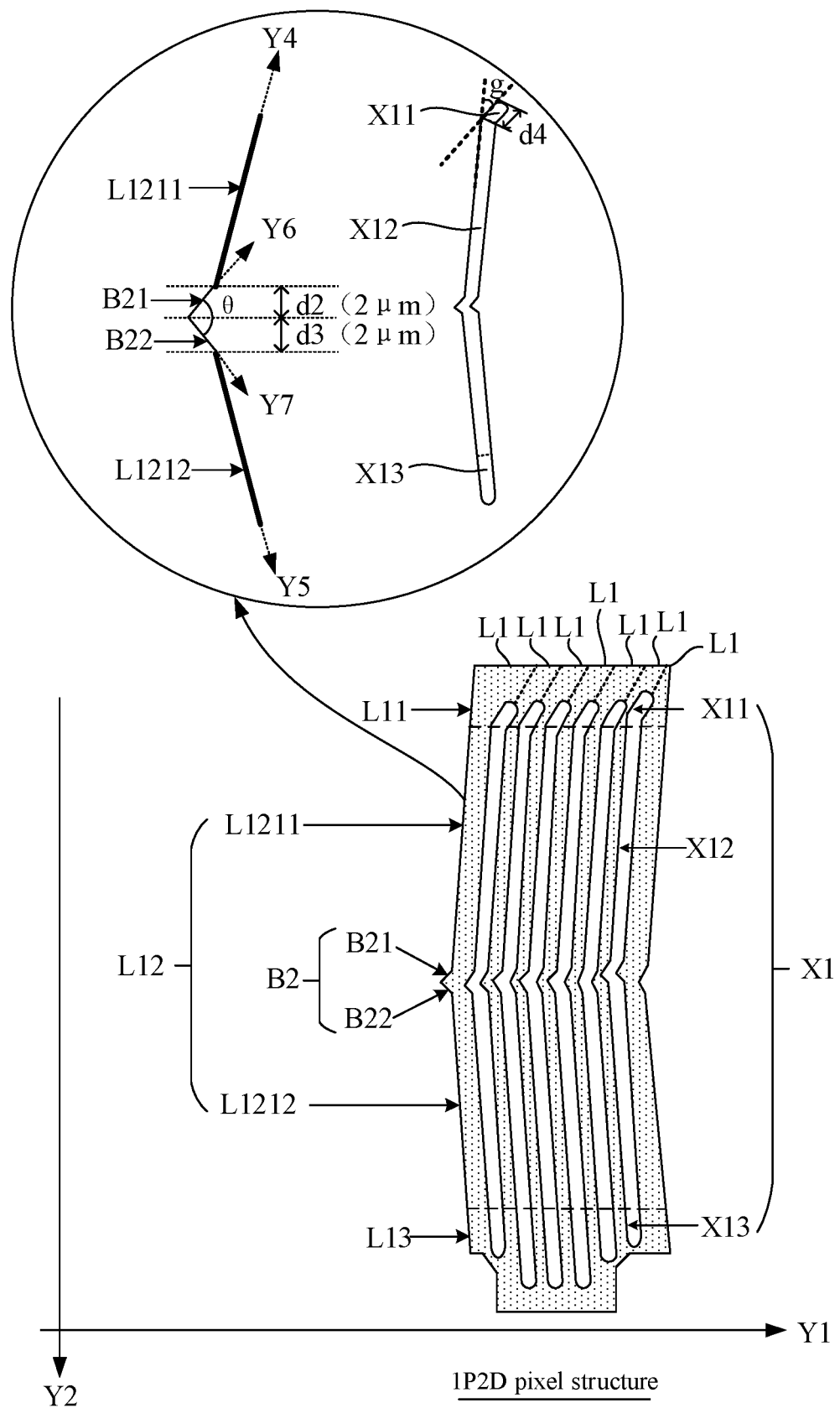
FIG. 9 is a schematic diagram of a structure of another second electrode in a 1P2D structure according to some embodiments of the present disclosure.

For example, referring to FIG. 9, in the embodiment of the present disclosure, it is also possible to design the depth d2 of the first corner portion B21 in the second direction Y2 and the depth d3 of the second corner portion B22 in the second direction Y2 to be equal to 2 µm. That is, it is possible to design the total depth of the intermediate corners in the second direction Y2 equal to 2+2 µm. Based on the embodiment, referring to FIG. 9, it can be seen that only the lower inner corner can be eliminated, while the upper inner corner can be retained. That is, it is possible to design the angle g at between the third slit segment X13 and the second slit segment X12 equal to 180 degrees and to design the angle g between the first slit segment X11 and the second slit segment X12 greater than or equal to 45 degrees and less than 180 degrees. Preferably, the angle g can be designed to be equal to 45 degrees. Furthermore, based on the structure, the width (which may also be called depth) d4 of the first slit segment X11 in the extending direction of the first slit segment X11 may be greater than or equal to 3 µm.

It should be noted that, for the embodiment structure shown in FIG. 9, it is mainly applicable to the structure in which the orthographic projection of the first end portion L11 on the substrate 10 is overlapped with the orthographic projection of the black matrix (BM) on the substrate 10 disposed on one side of the substrate 10. That is, the scenario where the upper corner is obscured by the BM is applicable. Because the transmittance, i.e., the luminous efficiency, cannot be improved even though the inner corner is eliminated in the scenario, reducing the depth of the middle corner can be considered to improve the luminous efficiency. That is, the total depth of the design intermediate corners is equal to 2+2 µm.

It should also be noted that the design of the total depth of the intermediate corner is related to the level of the equipment used to manufacture the intermediate corner, and it is sufficient to ensure that this intermediate corner has the shape shown in FIG. 8 or FIG. 9 above. The second electrode 02 illustrated in FIG. 8 includes six electrode branches L1 spaced sequentially in the first direction Y1. The second electrode 02 illustrated in FIG. 9 includes seven electrode branches L1 spaced sequentially in the first direction Y1. Embodiments of the present disclosure do not limit the number of electrode branches L1 included in the second electrode 02.

Optionally, in the embodiments of the present disclosure, the first electrode 01 and the second electrode 02 may both include indium tin oxide (ITO) material. The ITO material is generally a transparent material, such that a better transmittance of the display panel can be further ensured. Based on this, in the first electrode 01 and the second electrode 02, the first electrode 01 that is relatively close to the substrate 10 can be referred to as ITO1 and the second electrode 02 that is relatively distal from the substrate 10 can be referred to as ITO2.

Optionally, the display mode employed in the display panel including the above pixel structure may be a high-advanced dimension switch (HADS) display mode with a high opening rate.

It is noted that a second electrode 02 may be a monolithic structure, and the various parts (e.g., electrode branch L1) included in the second electrode 02 as described in the above embodiment are not physically independent.

Combined with the above embodiments, it can be seen that the solution described in the present disclosure can effectively improve the Trace Mura problem while effectively enhancing the transmittance and contrast of the display panel by only optimizing the design of the second electrode 02 structure based on not changing the structure of the liquid-crystal box. The specific optimization design can be summarized as follows:

(1) For the 1P1D pixel structure or 2P2D pixel structure, the inner corner is partially or completely eliminated, and only the outer corner on the same direction as the slit is retained, in which the angle $\alpha \geq 45°$ and the length $d1 \geq 2$ µm.

(2) For 1P2D pixel structure, the inner corners are partially or completely cancelled, and the total depth of the designed intermediate corners is equal to 3+3 µm, and the angle $\theta = 45°$, and the outer corners can be completely cancelled.

In summary, embodiments of the present disclosure provide a pixel structure. The pixel structure includes a first electrode, a second electrode, and a liquid-crystal layer disposed on one side of a substrate and successively stacked. The second electrode includes a plurality of electrode branches arranged sequentially in the first direction, and each of the two adjacent electrode branches have slits between them. In the second direction intersecting the first direction, each of the electrode branches includes a first end portion, a body portion and a second end portion, and the slit includes a first slit segment, a second slit segment and a third slit segment, and the first end portions of the plurality of electrode branches are communicated with each other, and the second end portions are communicated with each other. Because the angle between the first slit segment and/or the third slit segment and the second slit segment is equal to 180 degrees, it is possible to make the communication of the first end portions and/or the communication of the second end portions of each of the two adjacent electrode branches do not have inner corners. In this way, the transmittance of the display panel can be made better. Based on this, the shape of the electrode branches can be flexibly set to improve the Trace Mura problem and a better display quality of the display panel is ensured.

Figure 10:
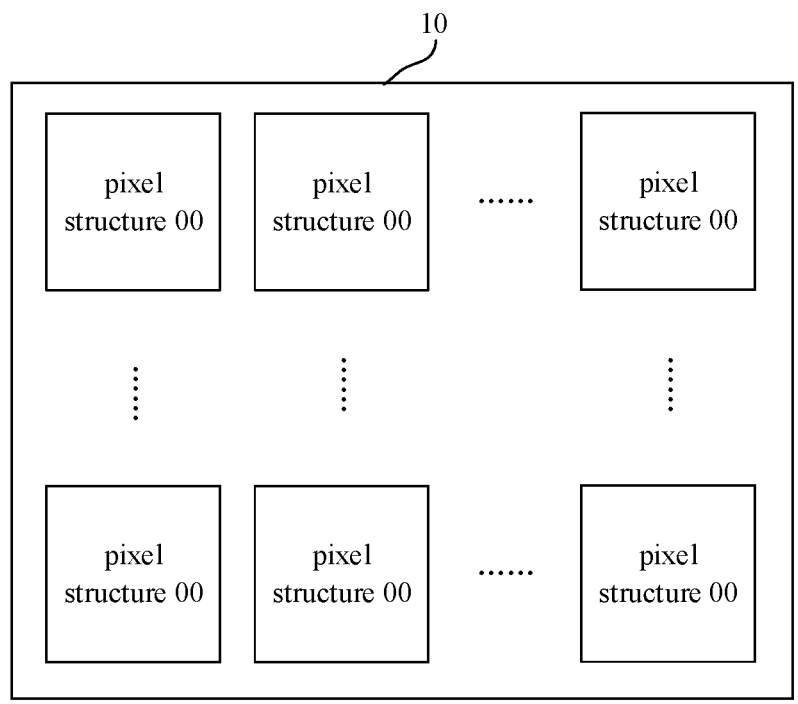
FIG. 10 is a schematic diagram of a structure of a display panel according to some embodiments of the present disclosure.
Figure 11:
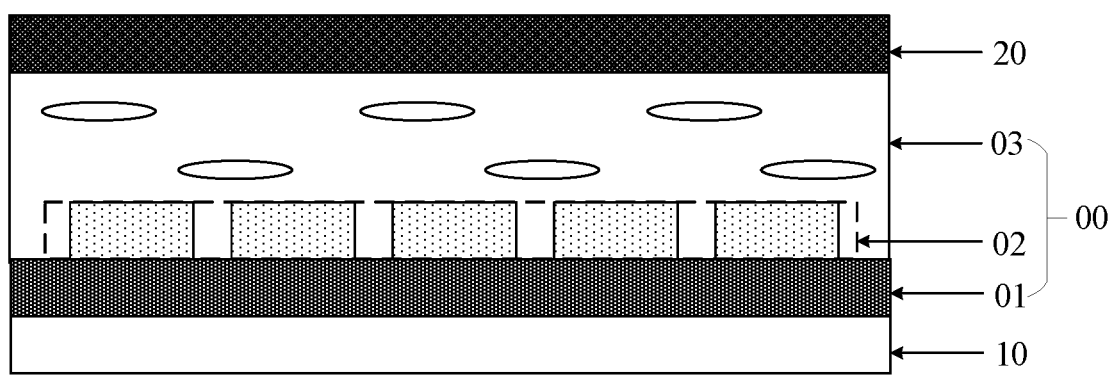
FIG. 11 is a schematic diagram of a structure of another display panel according to some embodiments of the present disclosure.

FIG. 10 is a schematic diagram of a structure of a display panel according to some embodiments of the present disclosure. FIG. 11 is a schematic diagram of the structure of another display panel according to some embodiments of the present disclosure.

Referring to FIG. 10 and FIG. 11, it can be seen that the display panel may include a substrate 10, a plurality of pixel structures 00 disposed on one side of the substrate 10 as shown in the accompanying drawings above, and a color filter CF 20 disposed on one side, distal from the substrate 10, of the pixel structures 00 which may also be referred to as a CF substrate. Optionally, with reference to FIG. 10, it can also be seen that the plurality of pixel structures 00 can be arranged in an array. Based on the above embodiments, it can be seen that the display panel including the pixel structure 00 has better transmittance and contrast without Trace.

Figure 12:
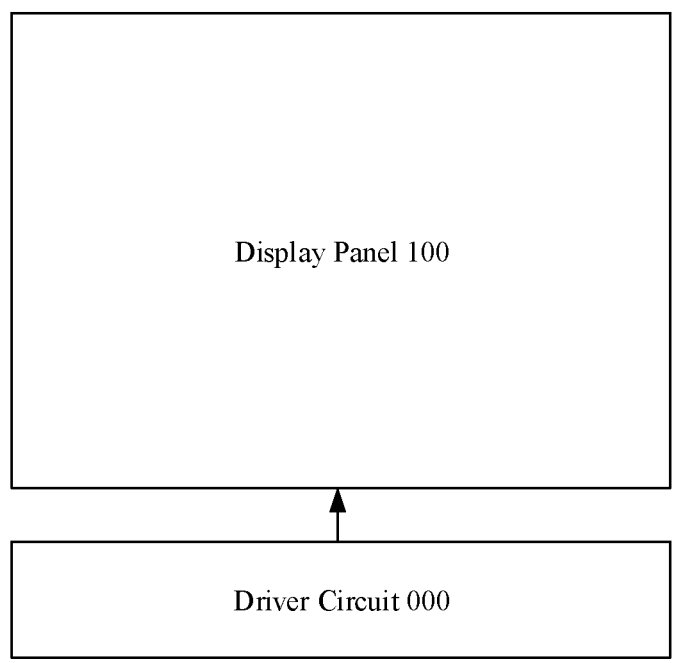
FIG. 12 is a schematic diagram of a structure of a display device according to some embodiments of the present disclosure.

FIG. 12 is a schematic diagram of the structure of a display device according to some embodiments of the present disclosure. As shown in FIG. 12, the display device may include a driver circuit 000, and a display panel 100 as shown in FIG. 10 or FIG. 11.

The driver circuit 000 may be connected to the display panel 100 and provide a drive signal to the pixel structure 00 in the display panel 100, thereby driving the pixel structure 00 to emit light. For example, the driver circuit 000 may provide a common voltage to a common electrode in the pixel structure 00.

Optionally, the display device described in embodiments of the present disclosure may be an LCD display device, a cell phone, a tablet computer, a flexible display device, a television set, and a monitor, and any other product or component having a display function.

The terms used in the embodiments of the present disclosure are used only for the purpose of explaining embodiments of the present disclosure and are not intended to limit the present disclosure. Unless otherwise defined, technical terms or scientific terms used in embodiments of the present disclosure shall have the ordinary meaning as understood by persons having ordinary skill in the art to which the present disclosure belongs.

For example, the words "first," "second," or "third" and the like as used in the specification of the patent application and claims of the disclosure do not indicate any order, number, or importance, but only to distinguish the different components.

Similarly, the words "a" or "one" and the like do not indicate a quantitative limitation, but rather the presence of at least one.

Similar words such as "includes" or "contains" are intended to indicate that the component or object present before "includes" or "contains" covers. The element or object preceding "includes" or "contains" covers the element or object appearing after "includes" or "contains" and its equivalent, and does not exclude other elements or objects.

The terms "up", "down", "left" or "right" are used only to indicate relative positional relationships. When the absolute position of the object being described changes, the relative position relationship may also change accordingly.

"And/or" indicates that three relationships may exist, e.g., A and/or B, which may indicate the presence of A alone, the presence of both A and B, and the presence of B alone. The character "/" generally indicates an "or" relationship between the associated former objects and later objects.

The above is only an optional embodiment of the present disclosure and is not intended to limit the present disclosure. Any modification, equivalent replacement, improvement, etc. made within the spirit and principles of the present disclosure shall be included in the scope of protection of the present disclosure.

What is claimed is:

1. A pixel structure, comprising:
a first electrode, a second electrode, and a liquid crystal layer that are disposed on one side of a substrate and successively stacked, wherein one of the first electrode and the second electrode is a pixel electrode and the other of the first electrode and the second electrode is a common electrode, and the second electrode comprises:
a plurality of electrode branches sequentially arranged in a first direction, wherein each of the electrode branches comprises a first end portion, a body portion, and a second end portion that are successively connected in a second direction, the body portion comprising at least one body segment, an extending direction of each of the body segments, an extending direction of the first end portion and an extending direction of the second end portion being intersected with the second direction, and the second direction being perpendicular to the first direction;
wherein the first end portions of the plurality of electrode branches are communicated with each other, the second end portions of the plurality of electrode branches are communicated with each other, the first end portions of at least two electrode branches are communicated with each other in an arc, the second end portions of at least two electrode branches are communicated with each other in an arc, and a slit is disposed between each of the two adjacent electrode branches, the slit comprising a first slit segment, a second slit segment and a third slit segment that are successively connected in the second direction, and an angle between at least one of the first slit segment and the third slit segment and the second slit segment being equal to 180 degrees;
further comprising: a thin film transistor, wherein the second electrode further comprises a connection portion;
wherein the thin film transistor is connected to the second end portion of the plurality of electrode branches by the connection portion, and is configured to supply a voltage to the plurality of electrode branches;
wherein in the plurality of electrode branches, one end of the second end portion in a second target electrode branch protrudes in a direction away from remaining electrode branches except the second target electrode branch;
wherein a protruding direction of the second end portion of the second target electrode branch is in a same direction as an inclining direction of the second end portion, and the inclining direction of the second end portion is an inclining direction of the second end portion to a side distal from the body portion;
wherein an extending direction of the connection portion does not overlap with an end portion of the third slit segment corresponding to the end of the second end portion in the second target electrode branch.

2. The pixel structure according to claim 1, wherein the first electrode is a common electrode, and the second electrode is a pixel electrode.

3. The pixel structure according to claim 1, wherein the body portion of each of the electrode branches comprises the body segment, and the extending direction of the body segment, the extending direction of the first end portion, and the extending direction of the second end portion are a third direction; and
in the plurality of electrode branches, one end of the first end portion in a first target electrode branch protrudes in a direction away from remaining electrode branches except the first target electrode branch;
wherein the first target electrode branch is an outermost electrode branch of the plurality of electrode branches, and a protruding direction of the first end portion of the first target electrode branch is a same direction as an inclining direction of the first end portion, and the inclining direction of the first end portion is an inclining direction of the first end portion to a side distal from the body portion.

4. The pixel structure according to claim 1, wherein in the second target electrode branch, an angle between the extending direction of the first end portion distal from the first target electrode branch and the third direction is less than or equal to 180 degrees.

5. The pixel structure according to claim 1, wherein a protruding end of the first target electrode branch and a protruding end of the second target electrode branch both comprise a first edge, a second edge, a third edge, and a fourth edge that are successively connected;
wherein the first edge extends in the first direction, the second edge extends in the third direction, an extending direction of the third edge is intersected with the third direction at an angle greater than or equal to 45 degrees and a length of the third edge is greater than or equal to 2 µm, and the fourth edge extends in a direction intersecting the extending direction of the third edge.

6. The pixel structure according to claim 5, wherein an angle between the extending direction of the third edge and the third direction is equal to 45 degrees or 60 degrees.

7. The pixel structure according to claim 5, wherein a length of the third edge is less than or equal to 5 µm.

8. The pixel structure according to claim 7, wherein the length of the third edge is greater than or equal to 3 µm.

9. The pixel structure according to claim 1, wherein the body portion of each of the electrode branches comprises a first body segment and a second body segment that are successively connected in the second direction;
wherein the first body segment is connected to the first end portion and the second body segment, and the second body segment is further connected to the second end portion;
wherein an extending direction of the first end and an extending direction of the first body segment are both a fourth direction, and an extending direction of the second end portion and an extending direction of the second body segment are both a fifth direction, the fourth direction being intersected with the fifth direction at an included angle between the fourth direction and the fifth direction greater than 90 degrees and less than 180 degrees.

10. The pixel structure according to claim 9, wherein at least one of the body portions of the electrode branches further comprises a corner portion, and the first body segment is connected to the second body segment by the corner portion;
wherein the corner portion comprises a first corner portion and a second corner portion connected in the second direction, the first corner portion is connected to the first body segment, and the second corner portion is connected to the second body segment;
wherein the first corner portion extends in a sixth direction and the second corner portion extends in a seventh direction; wherein the sixth direction is intersected with the fourth direction; the seventh direction is intersected with the fifth direction; the sixth direction being intersected with the seventh direction, and an angle between the sixth direction and the seventh direction is greater than or equal to 45 degrees and less than 180 degrees; and a depth of the first corner portion in the second direction and a depth of the second corner portion in the second direction are both greater than or equal to 2 µm.

11. The pixel structure according to claim 10, wherein an angle between the sixth direction and the seventh direction is equal to 45 degrees.

12. The pixel structure according to claim 10, wherein a depth of the first corner portion in the second direction and a depth of the second corner segment in the second direction are both equal to 3 µm.

13. The pixel structure according to claim 10, wherein
a depth of the first corner portion in the second direction and a depth of the second corner segment in the second direction are both equal to 2 µm;
an orthographic projection of the first end on the substrate is overlapped with an orthographic projection of a black matrix disposed on one side of the substrate on the substrate; and
an angle between the third slit segment and the second slit segment is equal to 180 degrees, an angle between the first slit segment and the second slit segment is greater than or equal to 45 degrees and less than 180 degrees, and a width of the first slit segment is greater than or equal to 3 µm in an extending direction of the first slit segment.

14. The pixel structure according to claim 13, wherein the angle between the first slit segment and the second slit segment is equal to 45 degrees.

15. The pixel structure according to claim 1, wherein an angle between the first slit segment and the second slit segment is equal to 180 degrees, and an angle between the third slit segment and the second slit segment is equal to 180 degrees.

16. The pixel structure according to claim 1, wherein the first electrode and the second electrode both comprises an indium tin oxide material.

17. A display panel, comprising: a substrate, a plurality of pixel structures, and a color filter disposed on a side, distal from the substrate, of the pixel structures;
wherein the each of the pixel structures comprises:
a first electrode, a second electrode, and a liquid crystal layer that are disposed on one side of a substrate and successively stacked, wherein one of the first electrode and the second electrode is a pixel electrode and the other of the first electrode and the second electrode is a common electrode, and the second electrode comprises:
a plurality of electrode branches sequentially arranged in a first direction, wherein each of the electrode branches comprises a first end portion, a body portion, and a second end portion that are successively connected in a second direction, the body portion comprising at least one body segment, an extending direction of each of the body segments, an extending direction of the first end portion and an extending direction of the second end portion being intersected with the second direction, and the second direction being perpendicular to the first direction;
wherein the first end portions of the plurality of electrode branches are communicated with each other, the second end portions of the plurality of electrode branches are communicated with each other, the first end portions of at least two electrode branches are communicated with each other in an arc, the second end portions of at least two electrode branches are communicated with each other in an arc, and a slit is disposed between each of the two adjacent electrode branches, the slit comprising a first slit segment, a second slit segment and a third slit segment that are successively connected in the second direction, and an angle between at least one of the first slit segment and the third slit segment and the second slit segment being equal to 180 degrees;
further comprising: a thin film transistor, wherein the second electrode further comprises a connection portion;
wherein the thin film transistor is connected to the second end portion of the plurality of electrode branches by the connection portion, and is configured to supply a voltage to the plurality of electrode branches;
wherein in the plurality of electrode branches, one end of the second end portion in a second target electrode branch protrudes in a direction away from remaining electrode branches except the second target electrode branch;
wherein a protruding direction of the second end portion of the second target electrode branch is in a same direction as an inclining direction of the second end portion, and the inclining direction of the second end portion is an inclining direction of the second end portion to a side distal from the body portion;
wherein an extending direction of the connection portion does not overlap with an end portion of the third slit segment corresponding to the end of the second end portion in the second target electrode branch.

18. A display device, comprising: a drive circuit, and a display panel;

wherein the drive circuit is connected to the display panel, and is configured to drive signals to a plurality of pixel structures in the display panel; and the display panel comprises: a substrate, the plurality of pixel structures, and a color filter disposed on a side, distal from the substrate, of the pixel structures;

wherein each of the pixel structures comprises:

a first electrode, a second electrode, and a liquid crystal layer that are disposed on one side of a substrate and successively stacked, wherein one of the first electrode and the second electrode is a pixel electrode and the other of the first electrode and the second electrode is a common electrode, and the second electrode comprises:

a plurality of electrode branches sequentially arranged in a first direction, wherein each of the electrode branches comprises a first end portion, a body portion, and a second end portion that are successively connected in a second direction, the body portion comprising at least one body segment, an extending direction of each of the body segments, an extending direction of the first end portion and an extending direction of the second end portion being intersected with the second direction, and the second direction being perpendicular to the first direction;

wherein the first end portions of the plurality of electrode branches are communicated with each other, the second end portions of the plurality of electrode branches are communicated with each other, the first end portions of at least two electrode branches are communicated with each other in an arc, the second end portions of at least two electrode branches are communicated with each other in an arc, and a slit is disposed between each of the two adjacent electrode branches, the slit comprising a first slit segment, a second slit segment and a third slit segment that are successively connected in the second direction, and an angle between at least one of the first slit segment and the third slit segment and the second slit segment being equal to 180 degrees;

further comprising: a thin film transistor, wherein the second electrode further comprises a connection portion:

wherein the thin film transistor is connected to the second end portion of the plurality of electrode branches by the connection portion, and is configured to supply a voltage to the plurality of electrode branches;

wherein in the plurality of electrode branches, one end of the second end portion in a second target electrode branch protrudes in a direction away from remaining electrode branches except the second target electrode branch;

wherein a protruding direction of the second end portion of the second target electrode branch is in a same direction as an inclining direction of the second end portion, and the inclining direction of the second end portion is an inclining direction of the second end portion to a side distal from the body portion;

wherein an extending direction of the connection portion does not overlap with an end portion of the third slit segment corresponding to the end of the second end portion in the second target electrode branch.

* * * * *